(12) United States Patent
Okada

(10) Patent No.: US 7,405,610 B2
(45) Date of Patent: Jul. 29, 2008

(54) TEMPERATURE COMPENSATION CIRCUIT

(75) Inventor: Hiroshi Okada, Aichi-ken (JP)

(73) Assignee: DENSO CORPORATION, Kariya (JP)

( * ) Notice: Subject to any disclaimer, the term of this patent is extended or adjusted under 35 U.S.C. 154(b) by 35 days.

(21) Appl. No.: 11/455,868

(22) Filed: Jun. 20, 2006

(65) Prior Publication Data
US 2006/0290408 A1 Dec. 28, 2006

(30) Foreign Application Priority Data
Jun. 22, 2005  (JP)  ............... 2005-181763

(51) Int. Cl.
*H03K 17/14* (2006.01)
*H01L 35/00* (2006.01)
(52) U.S. Cl. .................. 327/513; 327/362; 327/512; 327/378
(58) Field of Classification Search ........... 327/362, 327/512–513
See application file for complete search history.

(56) References Cited
U.S. PATENT DOCUMENTS
4,734,553 A * 3/1988 Noda .................... 219/711
5,867,031 A * 2/1999 Wang .................... 324/721
6,320,450 B1 * 11/2001 Lee et al. ................. 327/513
6,731,181 B2 * 5/2004 Fukayama et al. ......... 331/176

FOREIGN PATENT DOCUMENTS
EP  0503898  * 10/1992
JP  2003-110367  4/2003

* cited by examiner

*Primary Examiner*—Dinh T. Le
(74) *Attorney, Agent, or Firm*—Posz Law Group, PLC (57) ABSTRACT

A temperature compensation circuit consists of a thermo sensitive resistance, a fixed resistance, a logic buffer, and a logic inverter, without incorporating any operational amplifier. A resistance value of the thermo sensitive resistance is changed by temperature change. The fixed resistance has a small temperature changes that is smaller than that of the thermo sensitive resistance. Both the fixed resistance and the thermo sensitive resistance are connected electrically to an output terminal of the temperature compensation circuit. The logic buffer sets the other terminal of the fixed resistance to a first voltage that is one of a voltage level of a power source and a ground level. The logic inverter sets the other terminal of the thermo sensitive resistance to a second voltage that is reversed to the first voltage.

19 Claims, 7 Drawing Sheets

TEMPERATURE COMPENSATION CIRCUIT

CROSS-REFERENCE TO RELATED APPLICATIONS

This application is related to and claims priority from Japanese Patent Application No. 2005-181763 filed on Jun. 22, 2005, the contents of which are hereby incorporated by reference.

BACKGROUND OF THE INVENTION

1. Field of the Invention

The present invention relates generally to a temperature characteristic compensation circuit (or a temperature compensation circuit) capable of compensating the temperature characteristic of electric circuits such as various types of sensors.

2. Description of the Related Art

There is a conventional temperature characteristic compensation circuit (hereinafter referred to as "temperature compensation circuit") configured to compensate the temperature characteristic of a sensor. A semiconductor integrated circuit equipped with such a temperature compensation circuit has been widely used, which is capable of receiving a signal transferred from such a sensor, and amplifies the received signal, and outputs the amplified one to various electric circuits. For example, the Japanese laid open publication number JP 2003-110367 has disclosed such a semiconductor integrated circuit equipped with a temperature compensation circuit.

Figure 5:
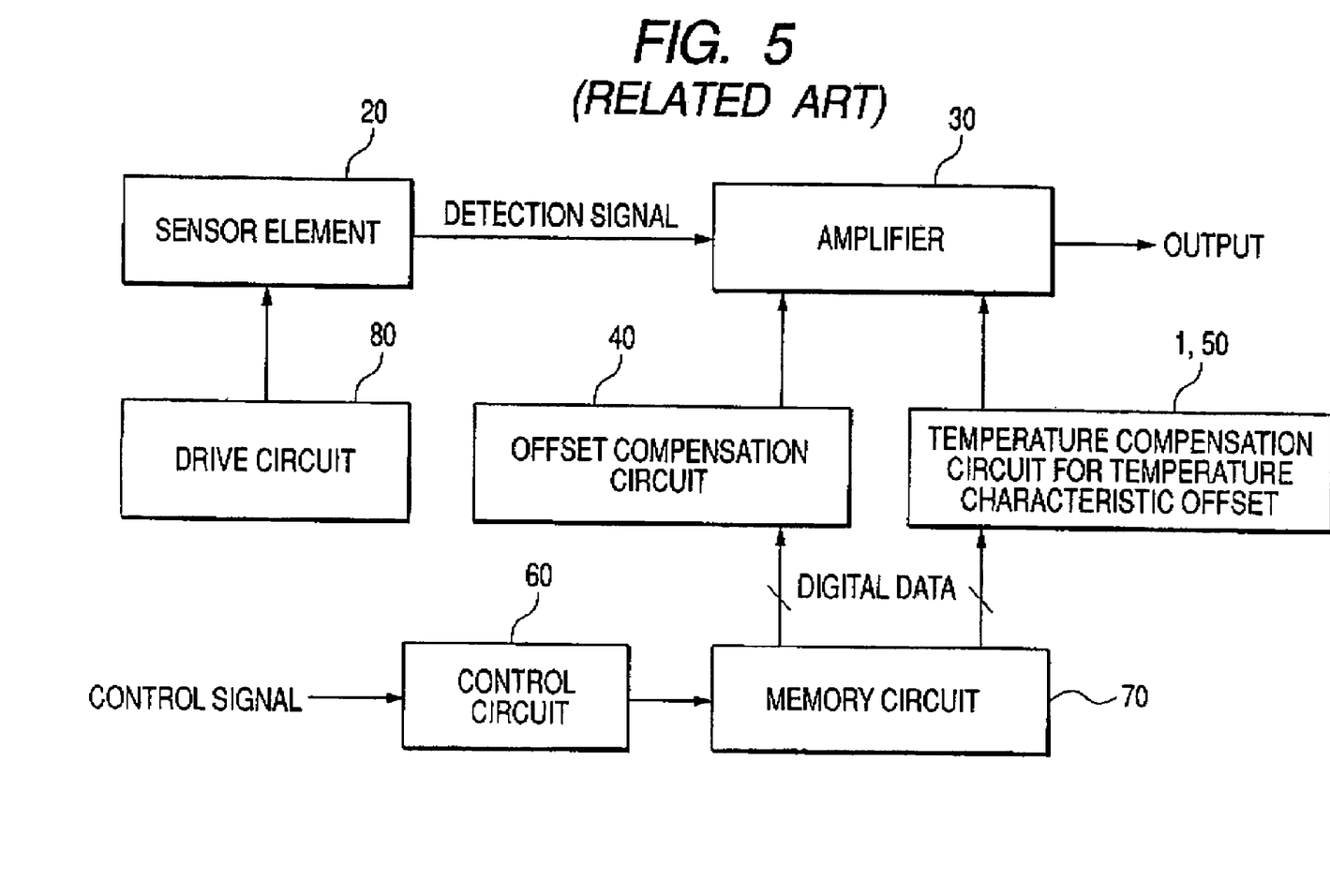
FIG. 5 is a block diagram showing a configuration of a semiconductor integrated circuit equipped with a temperature compensation circuit.

FIG. 5 is a block diagram showing a configuration of the semiconductor integrated circuit equipped with the temperature compensation circuit for such a sensor.

As shown in FIG. 5, the semiconductor integrated circuit consists of a sensor element 20, an amplifier 30, an offset compensation circuit 40, a temperature compensation circuit 50 for temperature characteristic offset, a control circuit 60, a memory circuit 70, and a driver circuit 80. The sensor element 20 consists of a bridge circuit (not shown) having plural resistance elements. The amplifier 30 receives a detection signal transferred from the bridge circuit (not shown) in the sensor element 20 and amplifies the received detection signal. The offset compensation circuit 40 compensates an offset generated by variation in resistance of each resistance element forming the bridge circuit. The temperature compensation circuit 50 for temperature characteristic offset is configured to compensate offset generated by variation of temperature characteristic of each resistance element in the sensor element. The control circuit 60 controls so that the memory circuit 70 stores digital data for compensation according to a control signal transferred from the outside of the semiconductor integrated circuit. The memory circuit 70 stores digital data for use in both the offset compensation circuit 40 and the temperature compensation circuit 50 for temperature characteristic offset. The drive circuit 80 drives a current flowing through the sensor element 20.

The offset temperature compensation circuit 40 outputs to the amplifier 30 a voltage for compensating the offset of the bridge circuit in the sensor element 20 according to the digital data for various offset compensations stored in the memory circuit 70.

The temperature compensation circuit 50 outputs to the amplifier 30 a voltage for compensating the temperature characteristic offset of the bridge circuit in the sensor element 20 according to the digital data for compensating the temperature characteristic offset stored in the memory circuit 70.

The amplifier 30 amplifies the detection signal transferred from the sensor element 20 while suppressing the influence of both the offset and the temperature characteristic offset that are amplified according to the voltages supplied from both the offset temperature compensation circuit 40 and the temperature compensation circuit 50.

The semiconductor integrated circuit shown in FIG. 5 has both the offset compensation circuit 40 and the temperature compensation circuit 50 in order to perform the different adjustments of the offset compensation and the compensation for the temperature characteristic offset based on the digital data stored in the memory circuit 70.

Figure 6:
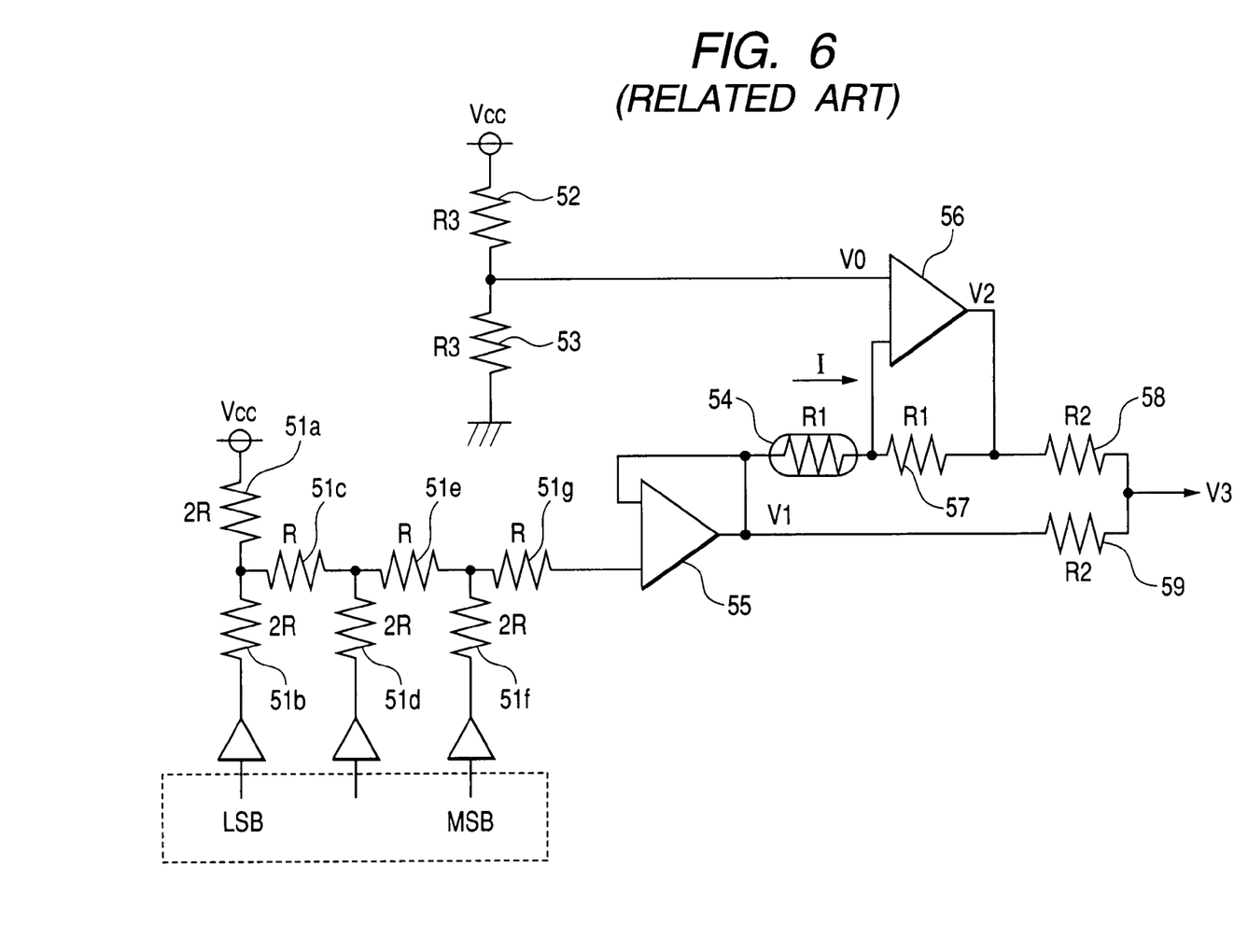
FIG. 6 is a circuit diagram showing the configuration of an offset temperature compensation circuit incorporated in the conventional semiconductor integrated circuit shown in FIG. 5.

FIG. 6 is a circuit diagram showing a configuration of the conventional offset temperature compensation circuit 50 incorporated in the semiconductor integrated circuit shown in FIG. 5.

The offset temperature compensation circuit 50 comprises a R-2R ladder resistance group made of resistances 51a to 51g, a base resistance 54, resistances 52, 53, and 57 to 59, and operational amplifiers 55 and 56. The base resistance 54 is made of a thermal sensitive resistance capable of changing its resistance value according to a temperature change.

Figure 7A:
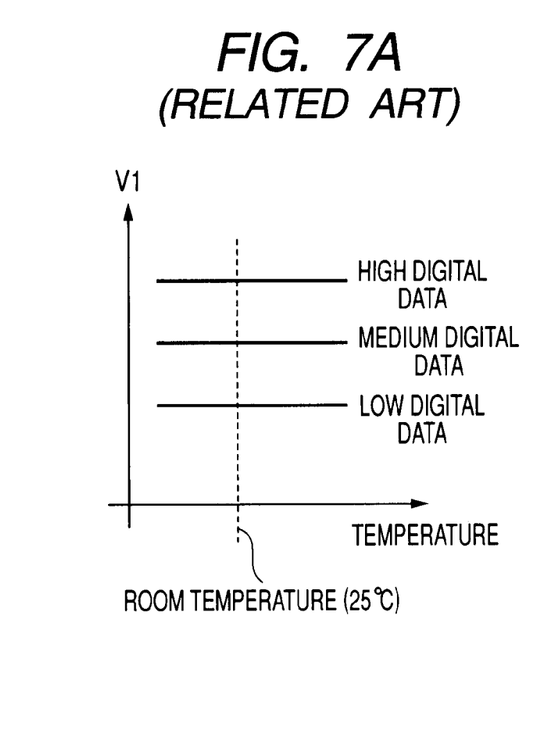
FIG. 7A shows a temperature characteristic of a voltage at an output terminal of one operational amplifier.
Figure 7B:
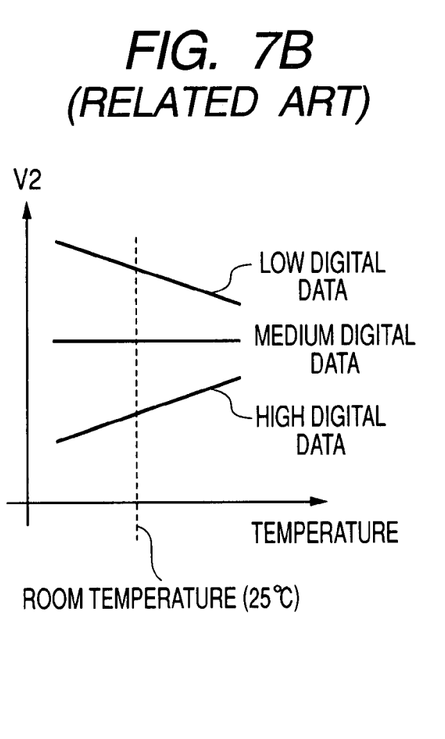
FIG. 7B shows a temperature characteristic of a voltage at an output terminal of another operational amplifier.
Figure 7C:
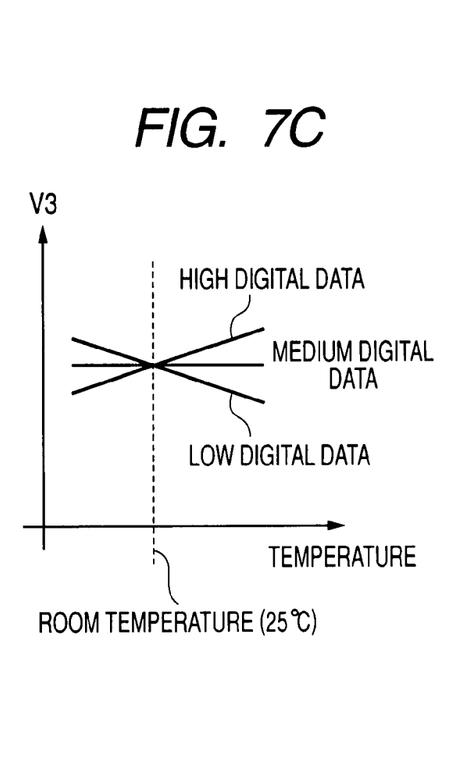
FIG. 7C shows a temperature characteristic of the voltage of a compensation signal.

FIG. 7A shows a temperature characteristic of a voltage V1 at an output terminal of the operational amplifier 55. FIG. 7B shows a temperature characteristic of a voltage V2 at an output terminal of the operational amplifier 56. FIG. 7C shows a temperature characteristic of a voltage (as a voltage of a compensation signal) V3 at a connection node between the resistances 58 and 59.

The entire resistance value of the R-R2 ladder resistance group composed of the resistances 51a to 51g is changed according to digital data (from the Least Significant Bit (LSB) to the Most Significant Bit (MSB)) stored in the memory circuit 70. Because the operational amplifier 55 is configured as a voltage follower, the voltage V1 at the output terminal of the operational amplifier 55 is changed according to the value of the digital data obtained from the memory circuit 70.

As a concrete example, FIG. 7A shows that the voltage V1 at the output terminal of the operational amplifier 55 increases according to the high digital data, and on the contrary, decreases according to the low digital data.

The current I that flows through the base resistance 54 can be expressed by the following equation (1).

$$I = (V1 - V0)/R1 \ (RT) \tag{1}$$

where V0 is a divided voltage of a power source voltage Vcc by the resistances 52 and 53, and R1 (RT) is a resistance value of the base resistance 54 at a room temperature.

Because the current that flows through the resistance 57 becomes equal to the current I flowing through the base resistance 54, the voltage $\Delta V$ between the both ends of the resistance 57 can be expressed by the following equation (2).

$$\Delta V = R1 \times I = R1(V1 - V0)/R1 \ (RT) \tag{2}$$

where R1 is the value if the resistance 57.

The voltage V2 at the output terminal of the operational amplifier 56 can be expressed by the following equation (3).

$$V2 = V0 - \Delta V = V0 - R1(V1 - V0)/R1 \ (RT) \tag{3}$$

When the digital data is a high value and the voltage V1 at the output terminal of the operational amplifier 55 is greater than the voltage V0, the value $\Delta V$ becomes a positive value and the voltage V2 at the output terminal of the operational amplifier 56 becomes low relatively. The absolute value of the voltage $\Delta V$ becomes low because the resistance R1 (RT) of the operational amplifier 56 is increased according to the temperature rise. Accordingly, the voltage V2 at the output terminal of the operational amplifier 56 has the characteristic indicated by the low digital data shown in FIG. 7B.

The voltage V3, namely the voltage of compensation signal, at the connection node between the resistances 58 and 59 takes the medium digital data between the voltage V2 and the voltage V1. Accordingly, the voltage V3 takes the different voltage characteristics according to the digital data at the temperature other than the room temperature. At the room temperature, the voltage V3 takes a constant voltage characteristic shown in FIG. 7C.

The amplifier 30 performs the compensation for the temperature characteristic offset of the sensor element 20 using the compensation signal voltage V3 which takes the different voltage characteristic according to the value of the digital data.

Because each resistance forming the sensor element 20 has a different temperature characteristic, namely, each sensor element 20 takes a different temperature characteristic, it is necessary to adjust the temperature characteristic offset per sensor element 20. Therefore this adjustment needs re-writing the compensation data (digital data) into the memory circuit 70 for each sensor element 20 while monitoring the voltage of the compensation signal in order to obtain the optimum compensation data.

However, a response delay occurs in each of the operational amplifiers 55 and 56 forming the temperature compensation circuit 50 mounted on the conventional semiconductor integrated circuit, and the response delay further causes the entire operation delay. As a result, it takes much time to perform the adjustment and to obtain the optimum compensation data.

SUMMARY OF THE INVENTION

It is an object of the present invention to provide an improved temperature compensation circuit, without incorporating operational amplifiers, to be applicable to various semiconductor integrated circuits and devices.

To achieve the above purposes, the present invention provides a temperature compensation circuit has a first thermo sensitive resistance, a first fixed resistance, a logic buffer as a first voltage fixing means, and a logic inverter as a second voltage fixing means.

A resistance value of the first thermo sensitive resistance is changed according to a temperature change. One end terminal thereof is connected electrically to an output terminal of the temperature compensation circuit. The first fixed resistance has a resistance change that is smaller than the resistance change of the first thermo sensitive resistance. One end of the first fixed resistance is connected electrically to the output terminal of the temperature compensation circuit. The logic buffer as the first voltage fixing means is configured to fix the other end terminal of the first fixed resistance to a first voltage which is one of a voltage level of a power source and a voltage level of ground. The logic inverter as the second voltage fixing means is configured to fix the other end terminal of the first thermo sensitive resistance to a second voltage which is reversed in voltage level to the first voltage.

Therefore the logical buffer as the first voltage fixing means sets the one end terminal of the first fixed resistance to the first voltage which is one of the voltage level of the power source and the voltage level of ground, and the logic inverter as the second voltage fixing means sets the first thermo sensitive resistance to the second voltage level that is reversed to the first voltage level. It is thereby possible to change the resistance value of the first thermo sensitive resistance according to the temperature change, and thereby to change the voltage level of the output terminal of the temperature compensation circuit. It is thereby possible to provide the improved temperature compensation circuit without using any operational amplifier. As a result, because the temperature compensation circuit according to the present invention has no operational amplifier, the temperature compensation circuit is capable of eliminate any operation delay to be caused by operational amplifiers when it is formed with those operational amplifiers.

According to another feature of the present invention, a temperature compensation circuit has a plurality of circuit stages that are electrically connected in multi stages. Each circuit stage in the temperature compensation circuit has a first thermo sensitive resistance, a first fixed resistance, a logical buffer as a first voltage fixing means, and a logical inverter as a first voltage fixing means. The resistance value of the first thermo sensitive resistance is changed according to a temperature change. The first fixed resistance has a resistance change that is smaller than the resistance change of the first thermo sensitive resistance. One end terminal of the first fixed resistance is connected electrically to one end terminal of the first thermo sensitive resistance. The logical buffer as the first voltage fixing means is configured to fix the other end terminal of the first fixed resistance to a first voltage which is one of a voltage level of a power source and a voltage level of ground. The logic inverter as the second voltage fixing means is configured to fix the other end terminal of the first thermo sensitive resistance to a second voltage which is reversed in voltage level to the first voltage. In the temperature compensation circuit according to the present invention, each of the circuit stages is connected electrically to each other through a second fixed resistance connected electrically to a connection node between the first fixed resistance and the thermal sensitive resistance in each circuit stage. The one end terminal of the fixed resistance and the one end terminal of the thermal sensitive resistance in the final circuit stage are connected electrically to an output terminal of the temperature compensation circuit.

Therefore because adjacent circuit stages are connected electrically in multi stages to each other through the second fixed resistance placed at the connection mode between the first fixed resistance in a preceding circuit stage and the first thermo sensitive resistance in the following circuit stage, the influence of the first thermo sensitive resistance to the voltage level of the output terminal can be changed in steps by the voltage level of the first and second voltages that are fixed by the first voltage fixing means and the second voltage fixing means in each circuit stage.

Further, because each first thermo sensitive resistance in the multi circuit stages is made of a thermister covered with a metal case, it is possible to reduce the magnitude of a temperature difference generated between the thermal sensitive temperatures.

Still further, because it is so formed that the resistance value of the thermal sensitive resistance at a room temperature is equal to the resistance value of the first fixed resistance, it is possible to set the voltage level of the output terminal of the temperature compensation circuit at a room temperature to an intermediate voltage level between the power source and the ground regardless of the fixed voltage level set by the first voltage fixing means and the second voltage level set by the second voltage fixing means.

Still further, because the first and second voltage fixing means fix the first voltage and the second voltage, respectively, according to the bit pattern of the digital signal to be supplied externally, it is possible to easily change the voltage characteristic of the output voltage at the output terminal of the temperature compensation circuit of the present invention.

In addition, the first voltage fixing means can be made of a logic buffer for outputting a same logic level of the digital signal to be supplied externally, and the second voltage fixing means can be made of a logic inverter for outputting a reversed logic level of the digital signal to be supplied externally.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Hereinafter, various embodiments of the present invention will be described with reference to the accompanying drawings. In the following description of the various embodiments, like reference characters or numerals designate like or equivalent component parts throughout the several diagrams.

Figure 1:
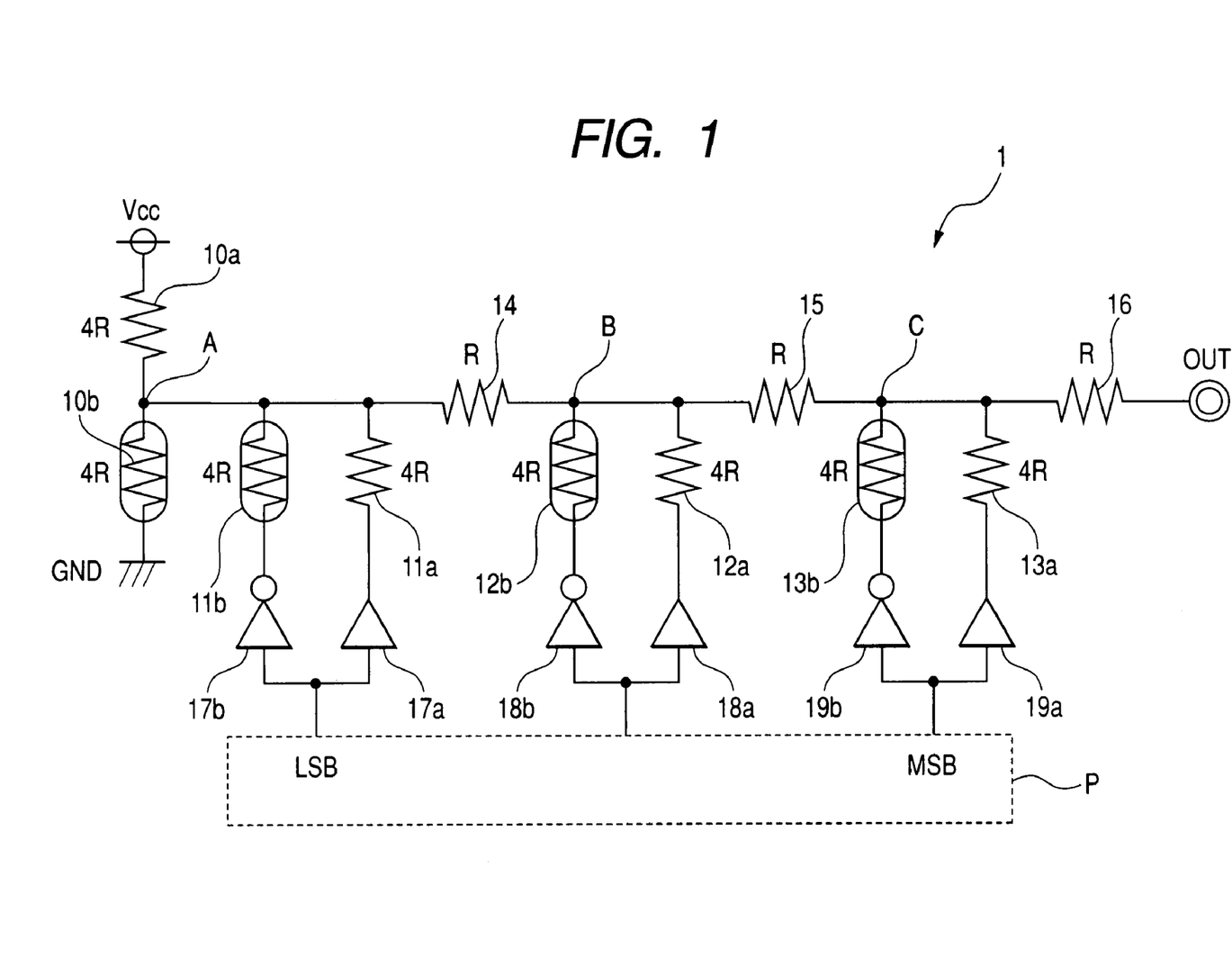
FIG. 1 is a circuit diagram showing the configuration of a temperature compensation circuit according to an embodiment of the present invention.

FIG. 1 is a circuit diagram showing the configuration of a temperature characteristic compensation circuit according to the embodiment of the present invention. Hereinafter, the temperature characteristic compensation circuit will be referred to as "the temperature compensation circuit" for brevity.

The temperature compensation circuit 1 of the embodiment is formed as a semiconductor integrated circuit.

The temperature compensation circuit 1 comprises fixed resistances 10a, 11a, 12a, 13a, and 14 to 16 without a temperature characteristic, thermal sensitive resistances 10b, 11b, 12b, and 13b with a temperature characteristic, logic buffers 17a, 18a, and 19a, and logic inverters 17b, 18b, and 19b.

Each of the fixed resistances 10a, 11a, 12a, 13a, and 14 to 16 is made of a thin film resistance having a small temperature coefficient of resistance (a small TCR). Each of the thermal sensitive resistances 10b, 11b, 12b, and 13b is made of a diffusion resistance having a large temperature coefficient of resistance (a large TCR) rather than the fixed resistances 10a, 11a, 12a, 13a, and 14 to 16. In a concrete example, the fixed resistance having a fixed temperature coefficient of resistance (a fixed TCR) is made of a chrome silicone (CrSi) thin film resistance of approximately zero ppm/° C. The thermal sensitive resistance is made of a diffusion resistance having TCR of approximately 2,000 ppm/° C. which is obtained by base diffusion.

In the temperature compensation circuit 1 of the embodiment, it is so formed that each of the fixed resistances 10a, 11a, 12a, and 13a has 4R and the each of the thermal sensitive resistances 10b, 11b, 12b, and 13b has 4R at the room temperature (for example 25° C.) when each value of the fixed resistances 14 to 16 is R. Further, the resistance of each of the thermal sensitive resistances 10b, 11b, 12b, and 13b becomes increased according to the temperature rise. Those thermal sensitive resistances are arranged so closed to each other in order to decrease the temperature difference between them as low as possible.

As shown in FIG. 1, the fixed resistance 10a and the thermal sensitive resistance 10b are placed between the power source terminal Vcc and the ground terminal GND, and the fixed resistance 10a and the thermal sensitive resistance 10b are electrically connected in series.

The connection node A between the fixed resistance 10a and the thermal sensitive resistance 10b is connected electrically to one end of the fixed resistance 11a and one end of the thermal sensitive resistance 10b.

The other end of the fixed resistance 11a is connected electrically to the output terminal of the logic buffer 17a, and the other end of the thermal sensitive resistance 11b is connected electrically to the output terminal of the logic inverter 17b.

The logic buffer 17a connects the other end of the fixed resistance 11a to one of the power source and the ground GND according to the voltage level of LSB of the digital data to be transferred from the outside of the temperature compensation circuit 1.

The logic inverter 17b connects the other end of the fixed resistance 11b to the reversed voltage level of the voltage level at the output terminal of the logic buffer 17a.

The connection node A between the fixed resistance 10a and the thermal sensitive resistance 10b is connected electrically to one end of the fixed resistance 12a and one end of the thermal sensitive resistance 12b. The output terminal of the logic buffer 18a is connected electrically to the other end of the fixed resistance 12a. The output terminal of the logic inverter 18b is connected electrically to the other end of the thermal sensitive resistance 12a.

The logic buffer 18a connects the other end of the fixed resistance 12a to the power source and the ground GND according to the voltage level of the intermediate bit of the digital data to be supplied from the outside of the temperature compensation circuit 1. The logic inverter 18b connects the other end of the thermal sensitive resistance 12b to the reversed voltage level of the voltage level at the output terminal of the logic buffer 18a.

The connection node B between the fixed resistance 12a and the thermal sensitive resistance 12b is connected electrically to one end of the fixed resistance 13a and one end of the thermal sensitive resistance 13b through the fixed resistance 15.

The other end of the fixed resistance 13a is connected electrically to the output terminal of the logic buffer 19a, and the other end of the thermal sensitive resistance 13b is connected electrically to the output terminal of the logic inverter 19b.

The logic buffer 19a connects the other end of the fixed resistance 13a to the power source and the ground GND according to the voltage level of the MSB of the digital data to be supplied from the outside of the temperature compensation circuit 1. The logic inverter 19b connects the other end of the thermal sensitive resistance 13b to the reversed voltage level of the voltage level at the output terminal of the logic buffer 19a.

The connection node C between the fixed resistance 13a and the thermal sensitive resistance 13b is connected electrically to the output terminal of the thermal sensitive circuit through the fixed resistance 16.

As described above, the temperature compensation circuit 1 of the embodiment comprises the first circuit stage, the second circuit stage, and the third circuit stage which are electrically connected in multi stages through the fixed resistances 14 and 15. The first circuit stage comprises the fixed resistance 11a, the thermal sensitive resistance 11b, the logic buffer 17a, and the logic inverter 17b. The second circuit stage comprises the fixed resistance 12a, the thermal sensitive resistance 12b, the logic buffer 18a, and the logic inverter 18b. The third circuit stage comprises the fixed resistance 13a, the thermal sensitive resistance 13b, the logic buffer 19a, and the logic inverter 19b.

The input terminal of the logic buffer 17a and the input terminal of the logic inverter 17b are connected electrically at the connection node through which those input terminals thereof receive the compensation data (digital data) of three bits to be transferred from the external memory (omitted from FIG. 1) through the digital terminal groups P.

Further, the input terminal of the logic buffer 18a and the input terminal of the logic inverter 18b are connected electrically at the connection node through which those input terminals thereof receive the compensation data (digital data) of three bits to be transferred from the external memory (omitted from FIG. 1) through the digital terminal groups P.

Still further, the input terminal of the logic buffer 19a and the input terminal of the logic inverter 19b are connected electrically at the connection node through which those input terminals thereof receive the compensation data (digital data) of three bits to be transferred from the external memory (omitted from FIG. 1) through the digital terminal groups P.

In a concrete example, each input terminal of the logic buffer 17a and the logic inverter 17b receives LSB of the compensation data, each input terminal of the logic buffer 18a and the logic inverter 18b receives intermediate bits of the compensation data, and each input terminal of the logic buffer 19a and the logic inverter 19b receives MSB of the compensation data.

Figure 2A:
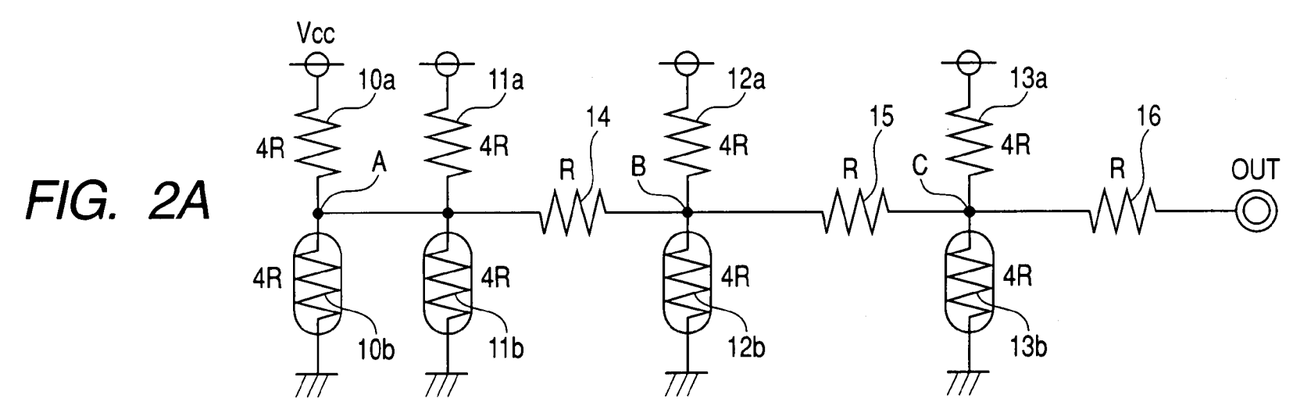
FIG. 2A shows an equivalent circuit on receiving compensation data (digital signal) of all high level bits.

FIG. 2A shows the equivalent circuit of the temperature compensation circuit 1 having the above configuration when the compensation data of all high level bits are provided from the external device (not shown).

As shown in FIG. 2A, the fixed resistances 10a, 11a, 12a, and 13a are connected electrically to the power source terminal Vcc, and the thermal sensitive resistances 10b, 11b, 12b, and 13b are connected electrically to the ground terminal GND.

At the room temperature such as 25° C., the voltage potential level of each of the output terminal OUT and the connection nodes A, B, and C has the intermediate voltage level, namely a half voltage level of the power source terminal Vcc.

When the ambient temperature of the temperature compensation circuit 1 of the embodiment drops below the room temperature, the magnitude of each of the thermal sensitive resistances 10b, 11b, 12b, and 13b is decreased, and the voltage level of each of the output terminal OUT and the connection nodes A, B, and C is also decreased.

On the contrary, when the ambient temperature of the temperature compensation circuit 1 of the embodiment rises and then exceeds the room temperature, the magnitude of each of the thermal sensitive resistances 10b, 11b, 12b, and 13b is increased, and the voltage level of each of the output terminal OUT and the connection nodes A, B, and C is also increased.

Figure 2B:
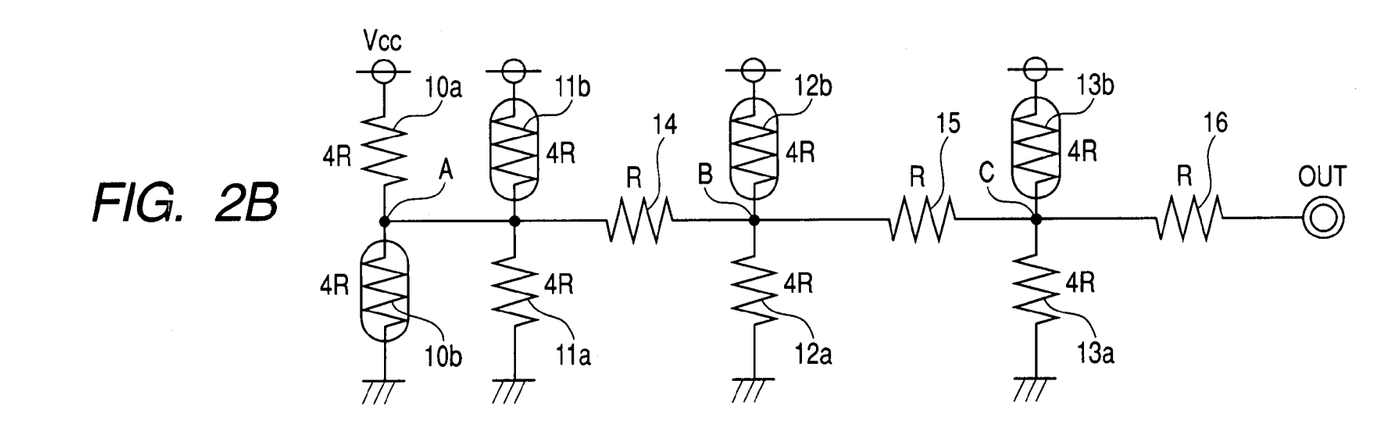
FIG. 2B shows an equivalent circuit on receiving compensation data (digital signal) of all low level bits.

Next, a description will now be given of the case where the compensation data of all low level bits are provided from the external device (not shown) to the temperature compensation circuit 1.

FIG. 2B shows the equivalent circuit of the temperature compensation circuit 1 having the above configuration when the compensation data of all low level bits are provided from the external device (not shown).

As shown in FIG. 2B, the fixed resistance 10a and the thermal sensitive resistances 11b, 12b, and 13b are connected electrically to the power source terminal Vcc. The thermal sensitive resistance 10b, the resistances 11a, 12a, and 13a are connected electrically to the ground terminal GND.

At the room temperature such as 25° C., the voltage potential level of each of the output terminal OUT and the connection nodes A, B, and C becomes the intermediate voltage level, namely a half voltage level of the power source terminal Vcc.

When the ambient temperature of the temperature compensation circuit 1 of the embodiment drops below the room temperature, the magnitude of each of the thermal sensitive resistances 10b, 11b, 12b, and 13b is decreased, and the voltage at the connection node A is not changed, namely keeps a constant level because the change of each of the thermal sensitive resistances 10b and 11b is set off. The voltages at the connection nodes B and C and the output terminal OUT are increased.

On the contrary, when the ambient temperature of the temperature compensation circuit 1 of the embodiment rises and exceeds the room temperature, the magnitude of each of the thermal sensitive resistances 10b, 11b, 12b, and 13b is increased, and the voltage at the connection node A is not changed, namely keeps a constant level because the change of each of the thermal sensitive resistances 10b and 11b is set off. The voltage level of each of the connection nodes B and C, and the output terminal OUT is also decreased.

As described above, the temperature compensation circuit 1 of the embodiment has the feature in which each of the fixed resistances 11a, 12a, 13a and the thermal sensitive resistances 11b, 12b, and 13b is connected electrically to one of the power source terminal Vcc and the ground terminal GND according to the compensation data to be supplied from the external device (not shown). In other words, according to the compensation data to be supplied from the external device, the temperature compensation circuit 1 of the embodiment can select one of a positive temperature characteristic and a negative temperature characteristic of the voltage to be supplied through the output terminal OUT to the external device of the temperature compensation circuit 1.

In the temperature compensation circuit 1, the thermal sensitive resistance 11b is connected electrically to the output terminal OUT through the resistances 14, 15 and 16, the thermal sensitive resistance 12b is connected electrically to the output terminal OUT through the resistances 15 to 16, and the thermal sensitive resistance 13b is connected electrically to the output terminal OUT through the resistance 16.

Because of the presence of the resistances 14, 15, and 16, the magnitude of the output voltage at the output terminal OUT is affected by each of the thermal sensitive resistances 13b, 12b, and 11b in order. That is, the thermal sensitive resistance 13b can provide the mostly strong effect to the magnitude of the output voltage at the output terminal OUT, and the thermal sensitive resistance 11b provides the least effect to the magnitude of the output voltage at the output terminal OUT.

Accordingly, it is possible to change gradually the temperature characteristic of the voltage at the output terminal OUT of the temperature compensation circuit 1 of the embodiment by changing the compensation data such as (000), (001), (010), . . . , and (111) within a range from the all low level bits (000) to the all high level bit (111), in order.

The all low level bit pattern (000) means that all of MSB, intermediate bit, and LSB take a low level. The all high level bit pattern (111) means that all of MSB, intermediate bit, and LSB take a high level.

The temperature characteristic of the voltage at the output terminal OUT of the temperature compensation circuit 1 has the same characteristic shown in FIG. 7C.

A description will now be given of the manner to adjust the offset temperature characteristic of the sensor element 20 in a case that the temperature compensation circuit 1 of the embodiment is applied to the semiconductor integrated circuit for the sensor element shown in FIG. 5.

First, the voltage output from the amplifier 30 in the semiconductor integrated circuit is measured at the room temperature (for example, 25° C.).

It is judged that the measured voltage is the intermediate voltage level of the power source voltage Vcc. At the room temperature, because the output voltage of the temperature compensation circuit 1 takes a constant level, namely the intermediate voltage level of the power source voltage Vcc regardless of the compensation data to be provided through the memory circuit 70 and the voltage of the amplifier 30 is not thereby changed, it is acceptable to set the compensation data to an optional value.

Next, the ambient temperature of the semiconductor integrated circuit for the sensor element 20 is changed to a temperature, for example, 100° C. that is different from the room temperature, the output voltage of the amplifier 30 in the semiconductor integrated circuit is measured.

Here, it can be considered that the offset temperature characteristic of the sensor element 20 provides a difference between the output voltage at the room temperature and the output voltage at another temperature such as 100° C.

The optimum compensation data is searched so that the output voltage of the amplifier 30 in the semiconductor integrated circuit for the sensor element 20 becomes equal to the output voltage measured at the room temperature, and then stored into the memory circuit 70 in the temperature compensation circuit 1 of the embodiment.

It is thereby possible to set the temperature compensation circuit 1 of the embodiment so that the output voltage from the amplifier 30 in the semiconductor integrated circuit is not affected from the ambient temperature.

As described above, in the semiconductor integrated circuit equipped with the temperature compensation circuit 1 of the embodiment, the optimum compensation data is searched so that the output voltages from the amplifier 30 at the room temperature and another different temperature take the same value, and the optimum compensation data reached is then stored in the memory circuit 70. It is thereby possible to compensate correctly the offset temperature characteristic of the sensor element 20.

The temperature compensation circuit 1 of the embodiment according to the present invention can be applied to a constant current circuit other than the semiconductor integrated circuit for the sensor element described above.

Next, a description will now be given of the operation of the temperature compensation circuit 1 according to the embodiment applied to a constant current circuit.

Figure 3:
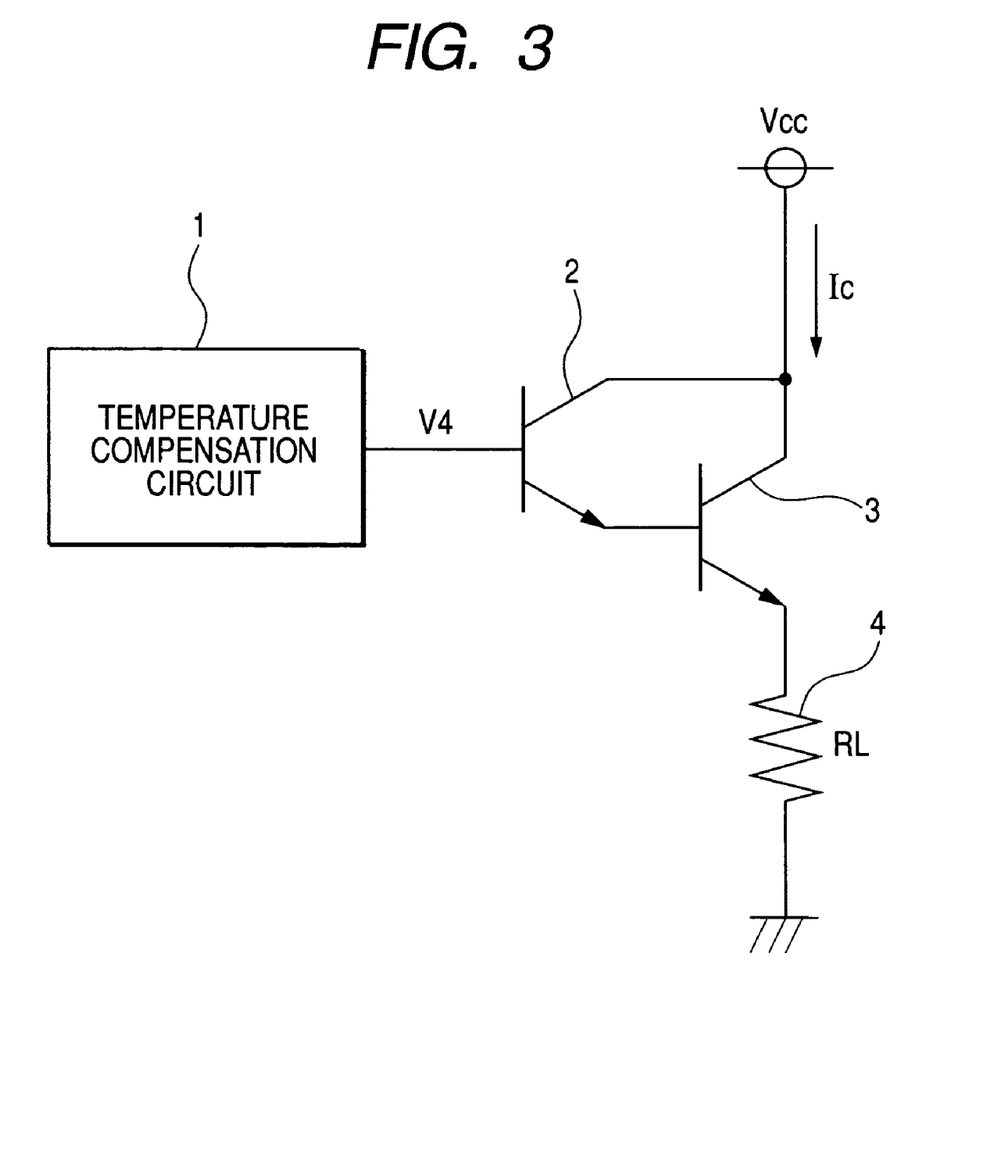
FIG. 3 shows an application example in which the temperature compensation circuit of the embodiment is applied to a constant current circuit.

FIG. 3 shows an application example that the temperature compensation circuit 1 of the embodiment is applied to a constant current circuit. The constant current circuit comprises the temperature compensation circuit 1, transistors 2 and 3 in Darlington connection, and a resistance 4.

The constant current circuit is so formed that a constant current (collector current Ic) flows according to the magnitude of the output voltage from the temperature compensation circuit 1 when this output voltage is applied to the base of the transistor 2 in Darlington connection.

The collector current I can be expressed by the following equation (4).

$$Ic=(V4-2Vbe)/RL \qquad (4),$$

where V4 is a voltage of the output terminal of the temperature compensation ciruict 1, Vbe is a voltage between the base and the emitter of each of the transistors 2 and 3, and RL is a value of the resistance 4.

The voltage Vbe between the base and the emitter of each of the transistors 2 and 3 has the temperature characteristic of approximately $-2$ mV/° C.

Therefore the constant current circuit can provide a constant current by adjusting the characteristic of the output voltage of the temperature compensation circuit 1 of the embodiment regardless of the change of the ambient temperature.

According to the configuration described above, the temperature compensation circuit 1 of the embodiment comprises the thermal sensitive resistance 11b, the fixed resistance 11a, the logic buffer 17a, and the logic inverter 17b. The fixed resistance 11a and the thermal sensitive resistance 11b are connected electrically to each other. The value of the thermal sensitive resistance 11b is largely changed according to the change of the ambient temperature. The value of the fixed resistance 11a is slightly changed according to the ambient temperature when compared with the change of the resistance 11b. The logic buffer 17a sets the other terminal of the fixed resistance 11a to one of the voltage power source and the ground GND. The logic inverter 17b sets the other terminal of the thermal sensitive resistance 11b to one of a second voltage whose potential level is reversed to that of a first voltage.

Thus, because through the logic buffer 17a the other end of the fixed resistance 17a is connected electrically to the first voltage level as one of the voltage power source Vcc and the ground GND, and the other end of the thermal sensitive resistance 17b is connected electrically to the second voltage level that is inverted to the first voltage level, the resistance value of the thermal sensitive resistance 11b is changed according to the change of the ambient temperature, and the voltage potential of the connection node between the fixed resistance 11a and the thermal sensitive resistance 11b is also changed. It is thereby possible to form the temperature compensation circuit without using any operational amplifier. As a result, according to the temperature compensation circuit of the embodiment, it is possible to eliminate any operation delay, for example, that is caused by the presence of the operational amplifiers incorporated in the conventional temperature compensation circuit.

The relationship between the configuration elements in the above embodiment and elements defined in claims is as follows.

The fixed resistances 11a, 12a, and 13a in the embodiment correspond to the first fixed resistances defined in claims, the fixed resistances 14 and 15 correspond to the second fixed resistances defined in claims, the fixed resistance 16 corresponds to the third fixed resistance defined in claims, the logic buffers 17a, 18a, and 19a correspond to the first voltage fixing means defined in claims, and the logic inverters 17b, 18b, and 19b correspond to the second voltage fixing means, as defined in claims.

However, the present invention is not limited by the above described embodiment, and it is possible to modify the configuration of the temperature compensation circuit according to the various applications and demands.

For example, although the embodiment has shown the cases that the temperature compensation circuit 1 is applied to both the semiconductor integrated circuit for the sensor element and the constant current circuit, it is acceptable to apply the temperature compensation circuit 1 to various types of sensors such as a pressure sensor using a piezo resistance element, a volume type acceleration sensor, and a rotational sensor using MRE, to a frequency adjusting circuit whose output signal characteristic is changed according to a temperature change.

In the embodiment, the fixed resistance is made of a chrome silicone (CrSi) thin film resistance. The present invention is not limited by this example. It is possible that the fixed resistance is made of a thin film resistance made of poly silicone (poly Si), a titanic tungsten thin film, or a nickel chrome thin film.

Although the above embodiment has disclosed the voltages having the different temperature characteristics according to the three bit digital data items, it is acceptable to output the voltages of different temperature characteristics according to digital data items of not less than three bits. For example, on using one bit as a digital data item, a circuit is formed only by using the fixed resistance 11, the thermal sensitive resistance 11b, the logic buffer 17a, and the logic inverter 17b as the circuit elements shown in FIG. 1. In this circuit configuration, it is acceptable to connect the connection node between the fixed resistance 11a and the thermal sensitive resistance 11b to the output terminal.

Furthermore, the above embodiment has shown the temperature compensation circuit 1 in which the first circuit stage, the second circuit stage, and the third circuit stage are electrically connected in multi stages through the fixed resistances 14 and 15. The first circuit stage comprises the fixed resistance 11a, the thermal sensitive resistance 11b, the logic buffer 17a, and the logic inverter 17b. The second circuit stage comprises the fixed resistance 12a, the thermal sensitive resistance 12b, the logic buffer 18a, and the logic inverter 18b. The third circuit stage comprises the fixed resistance 13a, the thermal sensitive resistance 13b, the logic buffer 19a, and the logic inverter 19b. However, the present invention is not limited by this configuration. It is acceptable for the temperature compensation circuit to output the voltage of different temperature characteristics according to digital data of not less than four bits. In this case, the number of the circuit stages should be increased.

Figure 4:
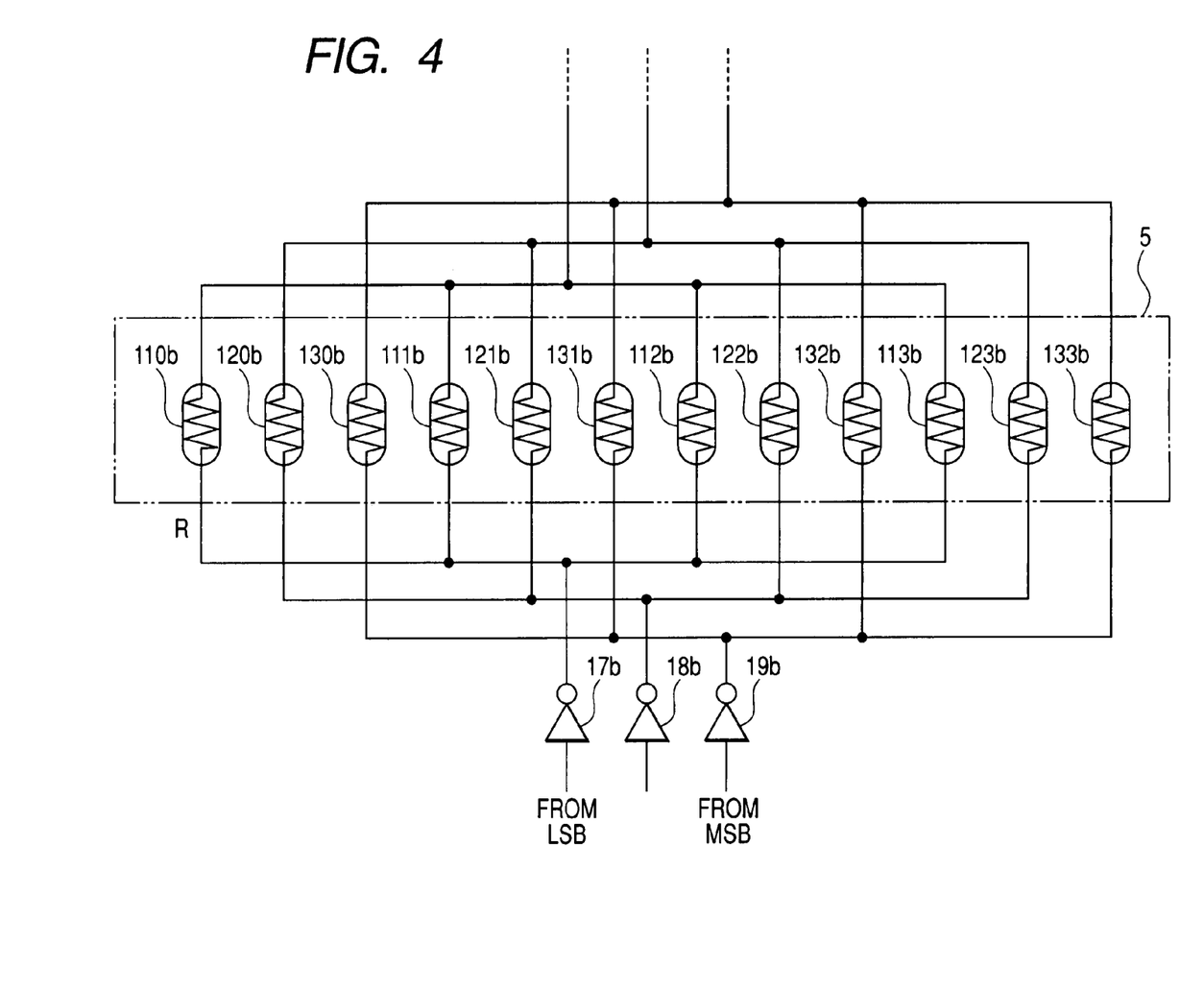
FIG. 4 is an arrangement example of a plurality of thermal sensitive resistances.

Because the temperature difference between the thermal sensitive resistances according to the arrangement of them in the temperature compensation circuit is increased when the number of the thermal sensitive resistances is increased, it is preferred to place the thermal sensitive resistances in a cross arrangement. For example, as shown in FIG. 4, the thermal sensitive resistance 11b is made of four thermal sensitive resistances 110b, 111b, 112b, and 113b electrically connected in parallel, the thermal sensitive resistance 12b is made of four thermal sensitive resistances 120, 121b, 122b, and 123b electrically connected in parallel, and the thermal sensitive resistance 13b is made of four thermal sensitive resistances 130, 131b, 132b, and 133b electrically connected in parallel. In this configuration, it is preferred to place those thermal sensitive resistances in a cross arrangement.

In addition, the above embodiment has disclosed that the temperature compensation circuit 1 is incorporated in the semiconductor integrated circuit, as shown in FIG. 5, for example, it is also acceptable to incorporate the temperature compensation circuit 1 in a hybrid circuit. In this case, it is possible to use a thermister and the like as the thermal sensitive resistance, and each thermal sensitive resistance is covered with aluminum case 5 or package having a high heat conductivity in order to reduce the temperature difference between the thermal sensitive resistances.

Although the above embodiment has disclosed the arrangement in which the fixed resistance 10a is placed near the voltage power source Vcc and the thermal sensitive resistance 10b is placed near the ground GND, the present invention is not limited by this configuration. For example, it is acceptable to place the fixed resistance 10a near the ground GND, and the thermal sensitive resistance 10b near the voltage power source Vcc.

Further, the above embodiment has disclosed the case that each resistance value of the thermal sensitive resistances 10b, 11b, 12b, and 13b is increased according to the temperature rise. The present invention is not limited by this case, for example, it is acceptable to decrease each resistance value of the thermal sensitive resistances 10b, 11b, 12b, and 13b according to the temperature rise Still further, according to the above embodiment, the terminal of each of the fixed resistances 11a, 12a, 13a and the thermal sensitive resistances 11b, 12b, and 13b is electrically connected to one of the voltage power source Vcc and the ground GND through the first voltage level fixing means such as the logic buffers 17a, 18a, and 19a and the second voltage level fixing means such as the logic inverters 17b, 18b, and 19b. However, the present invention is not limited by this configuration. For example, it is acceptable to connect electrically the terminal of each of the fixed resistances 11a, 12a, 13a and the thermal sensitive resistances 11b, 12b, and 13b to one of the voltage power source Vcc and the ground GND by making a short circuit with solder on a land pattern connected electrically to the voltage power source Vcc and a land pattern connected electrically to the ground GND formed on a printed board without using the logic buffers 17a, 18a, and 19a and the second voltage level fixing means such as the logic inverters 17b, 18b, and 19b. In this case, the first voltage fixing means and the second voltage fixing means can be formed by making a short circuit with sodium between each land pattern and the terminal of each resistance to be necessary for connection.

Moreover, the above embodiment has disclosed that the fixed resistance 10a and the thermal sensitive resistance 10b are placed between the voltage power source Vcc and the ground GND. The present invention is not limited by this configuration. For example, it is possible to form the temperature compensation circuit without using the fixed resistance 10a and the thermal sensitive resistance 10b. This case requires the reconsideration of the resistance value of each of the fixed resistances 11a to 13a, 14 and 16 and the thermal sensitive resistances 11b to 13b in order to design the total impedance of the temperature compensation circuit 1.

Still moreover, the above embodiment has disclosed the fixed resistances and the thermal sensitive resistances and each fixed resistance is made of CrSi thin film resistance of a small TCR (temperature coefficient resistance) and each thermal sensitive resistance is made of a thermal sensitive resistance of 2,000 ppm/° C. However, it is not necessary to use the fixed resistance whose TCR is 0 ppm/° C. For example, it is acceptable to use the fixed resistance whose TCR is approximately 1,000 ppm/° C.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalent thereof.

What is claimed is:

1. A temperature compensation circuit comprising:
   a first thermo sensitive resistance whose resistance value is changed according to a temperature change and whose one end terminal is connected electrically to an output terminal or the temperature compensation circuit;
   a first fixed resistance having a resistance change smaller than the resistance change of the first thermo sensitive resistance, and whose one end terminal being connected electrically to the output terminal of the temperature compensation circuit;
   first voltage fixing means configured to fix the other end terminal of the first fixed resistance to a first voltage which is one of a voltage level of a power source and a voltage level of ground; and
   second voltage fixing means configured to fix the other end terminal of the first thermo sensitive resistance to a second voltage which is reversed in voltage level with respect to the first voltage.

2. The temperature compensation circuit according to claim 1, wherein the resistance value of the first thermal sensitive resistance at a room temperature is equal to that of the first fixed resistance.

3. The temperature compensation circuit according to claim 1, wherein the first voltage fixing means and the second voltage fixing means are connected to one or more digital terminals, and fix the first voltage and the second voltage, respectively, according to a logical pattern of a digital signal to be supplied through the digital terminals.

4. The temperature compensation circuit according to claim 1, wherein the first voltage fixing means comprises a logic buffer configured to receive a digital signal to be supplied externally and to output an output signal whose logical level is equal to the digital signal received, and the second voltage fixing means comprises a logic inverter configured to receive the digital signal to be supplied externally and to output an output signal whose logical level is inversed to the digital signal received.

5. A semiconductor integrated circuit comprising:
   a sensor element configured to sense physical data of a target;
   a memory circuit for storing compensation data for a temperature characteristic offset for the sensor element; and
   the temperature compensation circuit according to claim 1 configured to compensate the temperature characteristic offset of the sensor element according to the compensation data stored in the memory circuit.

6. A temperature compensation circuit comprising a plurality of circuit stages electrically connected in multi stages, each circuit stage comprising:
   a first thermo sensitive resistance whose resistance value is changed according to a temperature change;
   a first fixed resistance having a resistance change smaller than the resistance change of the first thermo sensitive resistance, and whose one end terminal being connected electrically to one end terminal of the first thermo sensitive resistance;
   first voltage fixing means configured to fix the other end terminal of the first fixed resistance to a first voltage which is one of a voltage level of a power source and a voltage level of ground; and
   second voltage fixing means configured to fix the other end terminal of the first thermo sensitive resistance to a second voltage which is reversed in voltage level with respect to the first voltage, wherein each of the circuit stages is connected electrically to each other in multi stages through a second fixed resistance connected electrically to a connection node between the first fixed resistance and the thermal sensitive resistance in each circuit stage, and the one end terminal of the fixed resistance and the one end terminal of the thermal sensitive resistance in the final circuit stage are connected electrically to an output terminal of the temperature compensation circuit.

7. The temperature compensation circuit according to claim 6, further comprising:
   a fixed resistance whose one end terminal being connected electrically to a connection node between the first fixed resistance and the first thermo sensitive resistance in the initial circuit stage, and whose other end terminal being connected electrically to a terminal of the power source; and
   a thermal sensitive resistance whose one end terminal being connected electrically to the connection node between the first fixed resistance and the first thermo sensitive resistance in the initial circuit stage, and whose other end terminal being connected electrically to a ground terminal of the ground.

8. The temperature compensation circuit according to claim 6, further comprising an additional fixed resistance being electrically connected between the output terminal of the temperature compensation circuit and the connection node between the first fixed resistance and the first thermal sensitive resistance in the final circuit stage.

9. The temperature compensation circuit according to claim 7, further comprising a third fixed resistance being electrically connected between the output terminal of the temperature compensation circuit and the connection node between the first fixed resistance and the first thermal sensitive resistance in the final circuit stage.

10. The temperature compensation circuit according to claim 6, wherein the first thermo sensitive resistances in each circuit stage is made of a thermister covered with a metal case.

11. The temperature compensation circuit according to claim 7, wherein the first thermo sensitive resistances in each circuit stage is made of a thermister covered with a metal case.

12. The temperature compensation circuit according to claim 6, wherein the resistance value of the first fixed resistance is four times of that of the second fixed resistance.

13. The temperature compensation circuit according to claim 7, wherein the resistance value of the first fixed resistance is four times of that of the second fixed resistance.

14. The temperature compensation circuit according to claim 6, wherein the resistance value of the first thermal sensitive resistance at a room temperature is equal to that of the first fixed resistance.

15. The temperature compensation circuit according to claim 7, wherein the resistance value of the first thermal sensitive resistance at a room temperature is equal to that of the first fixed resistance.

16. The temperature compensation circuit according to claim 6, wherein the first voltage fixing means and the second voltage fixing means are connected to one or more digital terminals, and fix the first voltage and the second voltage, respectively, according to a logical pattern of a digital signal to be supplied through the digital terminals.

17. The temperature compensation circuit according to claim 7, wherein the first voltage fixing means and the second voltage fixing means are connected to one or more digital terminals, and fix the first voltage and the second voltage, respectively, according to a logical pattern of a digital signal to be supplied through the digital terminals.

18. The temperature compensation circuit according to claim 6, wherein the first voltage fixing means comprises a logic buffer configured to receive a digital signal to be supplied externally and to output an output signal whose logical level is equal to the digital signal received, and the second voltage fixing means comprises a logic inverter configured to receive the digital signal to be supplied externally and to output an output signal whose logical level is inversed to the digital signal received.

19. The temperature compensation circuit according to claim 7, wherein the first voltage fixing means comprises a logic buffer configured to receive a digital signal to be supplied externally and to output an output signal whose logical level is equal to the digital signal received, and the second voltage fixing means corrxpnses a logic inverter configured to receive the digital signal to be supplied externally and to output an output signal whose logical level is inversed to the digital signal received.

* * * * *